United States Patent
Fu

(10) Patent No.: US 7,294,245 B2
(45) Date of Patent: Nov. 13, 2007

(54) COVER RING AND SHIELD SUPPORTING A WAFER RING IN A PLASMA REACTOR

(75) Inventor: Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 10/857,217

(22) Filed: May 28, 2004

(65) Prior Publication Data

US 2004/0216998 A1 Nov. 4, 2004

Related U.S. Application Data

(62) Division of application No. 10/068,669, filed on Feb. 5, 2002, now Pat. No. 6,743,340.

(51) Int. Cl.
*C23C 14/35* (2006.01)
(52) U.S. Cl. ............ 204/298.11; 204/298.16; 118/720; 118/721
(58) Field of Classification Search ........... 204/298.11, 204/298.15, 298.16; 118/720, 721
See application file for complete search history.

(56) References Cited

U.S. PATENT DOCUMENTS

| | | | | |
|---|---|---|---|---|
| 4,500,409 A | | 2/1985 | Boys et al. ............... 204/298 |
| 5,444,207 A | * | 8/1995 | Sekine et al. .......... 219/121.43 |
| 5,496,455 A | * | 3/1996 | Dill et al. ............... 204/192.12 |
| 5,519,373 A | | 5/1996 | Miyata ....................... 335/306 |
| 5,527,438 A | | 6/1996 | Tepman .................. 204/192.12 |
| 5,589,039 A | | 12/1996 | Hsu ........................ 204/192.12 |
| 5,593,551 A | | 1/1997 | Lai ......................... 204/192.12 |
| 5,616,218 A | | 4/1997 | Alex ....................... 204/192.15 |
| 5,660,744 A | | 8/1997 | Sekine et al. .......... 219/121.43 |
| 5,666,247 A | | 9/1997 | Shultz ........................ 360/113 |
| 5,763,851 A | * | 6/1998 | Forster et al. ......... 219/121.43 |
| 5,897,752 A | * | 4/1999 | Hong et al. ............ 204/192.12 |
| 5,945,008 A | | 8/1999 | Kisakibaru et al. ........... 216/71 |
| 6,014,943 A | | 1/2000 | Arami et al. ............ 118/723 E |
| 6,051,122 A | * | 4/2000 | Flanigan ................. 204/298.11 |
| 6,077,403 A | | 6/2000 | Kobayashi et al. .... 204/192.12 |

(Continued)

OTHER PUBLICATIONS

Zorpette, "The quest for the sp", *IEEE Spectrum*, Dec. 2001, 30-35pp.

(Continued)

*Primary Examiner*—Rodney G. McDonald
(74) *Attorney, Agent, or Firm*—Law Offices of Charles Guenzer

(57) ABSTRACT

A magnetic dipole ring assembly positioned inside a vacuum chamber and around a wafer being sputter deposited with a ferromagnetic material such as NiFe or other magnetic materials so that the material is deposited with a predetermined magnetization direction in the plane of the wafer. The magnetic dipole ring may include 8 or more arc-shaped magnet segments arranged in a circle with the respective magnetization directions precessing by 720° around the ring. The dipole ring is preferably encapsulated in a vacuum-tight stainless steel carrier and placed inside the vacuum chamber. The carrier may be detachably mounted on a cover ring, on the shield, or on the interior of the chamber sidewall. In another embodiment, the magnet is a magnetic disk placed under the wafer. Such auxiliary magnets allow the magnetron sputter deposition of aligned magnetic layers.

15 Claims, 6 Drawing Sheets

U.S. PATENT DOCUMENTS

| | | | |
|---|---|---|---|
| 6,132,575 A | 10/2000 | Pandumsoporn et al. | 204/298.06 |
| 6,156,170 A | 12/2000 | Akari et al. | 204/298.18 |
| 6,190,495 B1 | 2/2001 | Kubota et al. | 156/345 |
| 6,743,340 B2 * | 6/2004 | Fu | 204/192.12 |

OTHER PUBLICATIONS

Johnson, "Magnetoelectronic memories last and last . . . " *IEEE Spectrum*, Feb. 2000, 33-40 pp.

Parkin et al., "Exchange-biased magnetic tunnel junctions and application to nonvolatile magnetic random access memory (invited)", *Journal of Applied Physics*, vol. 85, No. 8, Apr. 15, 1999, 5828-5833pp.

Liu et al., "New rare-earth permanent magnets with an intrinsic coercivity of 10 kOe at 500° C, *Journal of Applied Physics*", vol. 85, No. 8, Apr. 15, 1999, 5660-5662.

Tehrani et al., "High density submicron magnetoresistive random access memory (invited)" *Journal of Applied Physics*, vol. 85, No. 8, Apr. 15, 1999, 5822-5827 pp.

* cited by examiner

US 7,294,245 B2

COVER RING AND SHIELD SUPPORTING A WAFER RING IN A PLASMA REACTOR

RELATED APPLICATION

This application is a division of Ser. No. 10/068,669, filed Feb. 5, 2002 and to be issued as U.S. Pat. No. 6,743,340.

BACKGROUND OF THE INVENTION

1. Field of the Invention

The invention relates generally to sputtering of materials. In particular, the invention relates to the auxiliary magnets used in the sputtering of magnetic materials.

2. Background Art

Magnetic random access magnetic memory (MRAM), also called magnetoelectronic memory, is receiving increased interest and is expected to shortly enter commercial manufacture. MRAM as currently conceived involves the integration of magnetic materials into semiconductor integrated circuits to produce chips having millions of memory cells on which information can be written and read. When it is fabricated on a silicon wafer, silicon support circuitry can be included on the same wafer. Importantly, the MRAM is non-volatile memory. In a write operation, the magnetic material is poled into one of two magnetic states. In a read operation, the magnetic state of the poled material is determined. The magnetic state of the memory is maintained in the quiescent period between the write and read operations with no power being applied to the memory cell.

Many forms of MRAM have been contemplated, some of which are reviewed by Johnson in "Magnetoelectronic memories last and last . . . ," *IEEE Spectrum*, vol. 37, no. 2, February 2000, pp. 33-40. One form includes a magnetic tunneling junction (MTJ), which is explained in more detail by Parkin et al. in "Exchange-biased magnetic tunnel junctions and application to nonvolatile magnetic random access memory," *Journal of Applied Physics*, vol. 85, no. 8, 15 Apr. 1999, pp. 5828-5833. FIG. 1 is a schematic cross-sectional view of one MTJ cell 10 in a large two-dimensional array. The many cells 10 are formed by fairly standard techniques well developed for the most part in the semiconductor integrated circuit industry. Furthermore, when the magnetic cell is fabricated on a silicon wafer, silicon support circuitry can be integrated on the same wafer as the magnetic memory.

The magnetic storage cell 10 is centered on a junction structure 12 including a fixed magnetic layer 14 and a free magnetic layer 16 separated by a very thin non-magnetic tunneling barrier 18. Both magnetic layer 14, 16 are relatively thin, typically on the order of 1 to 20 nm thick. In the most prevalent MRAM design, the magnetic layers 14, 18 are electrically conductive, and the tunneling barrier 18 is a very thin electrically insulating layer, typically on the order of less than 2 mn or even 1 nm. The extreme thinness allows quantum mechanical electron tunneling through the otherwise dielectric barrier 18. An alternative structure replaces the dielectric barrier with a metal barrier through which spin can tunnel, as described by Tehrani et al. in "High density submicron magnetoresistive random access memory," *Journal of Applied Physics*, vol. 85, no. 8, 15 Apr. 1999, pp. 5822-5827. Somewhat similar magnetic stacks may be used to form spin valves or spin transistors, as Zorbette describes in "The quest for the spin transistor," *IEEE Spectrum*, vol. 38, no. 12, Dec. 2001, pp. 30-35.

The two magnetic layers 14, 16 of the MTJ cell 10 are distinguished in that the fixed magnetic layer 14 has a predetermined magnetization, for example, in one of the two horizontal directions of the illustrations, while the free magnetic layer 16 can be semi-permanently poled and repoled into either of the two horizontal directions. Which horizontal direction determines the state of the memory cell 10. The magnetic layers 14, 16 are typical composed of transition metals and their alloys, for example, NiFe, CoFe, Co, or Ru or a bilayer or sandwich structure of such materials. The iron alloys are typically rich in the transition metal, for example, $Ni_{80}Fe_{10}$ or $Co_{90}Fe_{10}$. The barrier 18 may be composed of oxidized aluminum. The distinction between fixed and free magnetic layers may be determined by the fixed layer being grown on an anti-ferromagnetic layer, also called the exchange-bias layer which prevents the adjacent fixed magnetic layer from changing state. The exchange-bias layer is typically a manganese alloy, for example, $Pt_{50}Mn_{50}$. Other anti-ferromagnetic compositions include MnFe, MnIr, MnRh, NiO, TbCo, and iridium alloys. The exchange-bias layer allows the two magnetic layers 14, 16 to have the same composition. Other buffer, transition, and capping layers are typically included in the stack structure.

In the illustrated MTJ cell 10, a metallic bit line 20 is electrically connected to the free magnetic layer 14 of the storage structure 12 as well as to many other cells 10 in the plane of the illustration. The fixed magnetic layer 14 is electrically connected to a conductive cross connector 22 electrically selected by an isolation transistor 24. In this embodiment, it is assumed that the isolation transistor 24 is individually selected for each memory cell 10. A digit line 26 underlies the storage structure 12 and runs orthogonally to the bit line 18 in the two-dimensional memory array.

The operation of the memory cell 10 relies upon the effect that the impedance of the storage structure 12 when the two magnetic layers 14, 16 are aligned to be parallel, as illustrated in the schematic illustration of FIG. 2, is significantly less than the impedance when the two magnetic layer 14, 16 are aligned to be anti-parallel, as illustrated in the schematic illustration of FIG. 3. The impedance depends upon quantum mechanical spin effects between the two magnetic layers 14, 16 and may be measured as either voltage or current by measuring circuitry gated by the isolation transistor 24, usually in comparison to a reference cell. The measuring electrical path proceeds from the bit line 20 through the storage structure 12, cross connect 22 and isolation transistor 24.

It is possible to initially pole the fixed layer 14 (as well as the free layer 16) with a large current pulse and thereafter in operation use lesser currents to switch only the free layer 16. However, for a large dense memory, the one-time poling of the fixed layer 14 significantly complicates the chip design. It is much preferred that the magnetization direction of the fixed magnetic layer 14 be impressed during the growth of the fixed layer 14 and that in operation the fixed layer 14 remain permanently polarized. On the other hand, during operation the magnetization direction of the free magnetic layer 16 can be written and rewritten in selected directions according to orthogonal currents passed through the bit line 20 and the digit line 26. Once the magnetic state is written into the storage cell 10, it remains until rewritten. Whatever state is currently written in the storage cell 10 is read by measuring the impedance of the storage structure 12. It is important that the magnetization direction impressed during growth of the fixed magnetic layer 14 be properly aligned with the bit and digit lines 20, 26. Any significant misalignment, for example, more than 5 or 10°, degrades the impedance differential between the two memory states.

The magnetic layers 14, 16 are conveniently formed of a magnetic metal such as NiFe or CoFe by a sputtering process using a sputtering target of approximately the same composition. Sputtering has the advantage of a relatively high sputtering rate using relatively expensive source materials in a relatively simple sputter reactor. However, sputtering of the stated magnetic layers presents some difficulties. Usually magnetron sputtering is employed in which a magnetron is positioned in back of the target to create a magnetic field in front of the target to increase the plasma density and hence the sputtering rate. However, the magnetic characteristics of the target inhibits the effect of the magnetron.

A more difficult problem arises when it is desired to deposit the fixed magnetic layer 14 with its magnetization fixed in a predetermined direction determined by the bit and digit lines 20, 26. In the past, such selective magnetization during deposition has been accomplished by placing coils or other means outside the sidewalls of the deposition chamber. The magnetic direction of the magnetic means determines the magnetization of the magnetic metal being deposited. However, these prior approaches of placing the magnetic means outside the chamber suffer from excessive size and further require a redesign of the vacuum chamber and its ports.

Sekine et al. in U.S. Pat. No. 5,660,744 have suggested the use of a Halbach magnet array, also called a magnetic dipole ring, for creating a uniform magnetic field for confining and intensifying a plasma, primarily in the context of reactive ion etching although with brief reference to sputtering. Such magnet arrays will be described in detail later. However, the Sekine implementation suffers from the disadvantage of being positioned outside the vacuum chamber and hence requiring a significant chamber redesign to incorporate a magnet into a sputtering reactor system already designed for non-magnetic sputtering. Miyata in U.S. Pat. No. 5,519,373 more explicitly refers to the use of a magnetic dipole ring in a sputter reactor as the principal magnetron for creating a high density plasma. It too suffers from being located outside the vacuum chamber.

SUMMARY OF THE INVENTION

Magnetic material and particularly ferromagnetic material may be sputter deposited on a substrate by imposing a substantially uniform magnetic field parallel to the face of the substrate during deposition. The magnet assembly producing the field may be inserted within the vacuum chamber.

In one embodiment, the magnet assembly is a magnetic dipole ring comprising a plurality of eight or more magnets arranged in a ring around the substrate. The magnets may be contiguous segments having arc shapes. The magnetization directions of the magnets precesses by 720° around the ring. Such a dipole magnet ring produces a substantially uniform magnetic field inside the ring.

Advantageously, the dipole ring is encapsulated in a vacuum tight, vacuum compatible material such as stainless steel. Further advantageously, the magnets of the dipole ring are formed of a magnetic material having a Curie temperature above 200° C., thereby allowing the sputter reactor to be baked out while the magnet ring is placed inside the reactor.

The dipole ring may be detachable mounted on a cover ring used to protect the periphery of the pedestal supporting the substrate being sputter coated.

Alternatively, the dipole ring may be disposed between the chamber shield and the chamber sidewall. In this position, the dipole ring may be supported on the chamber sidewall or by the shield. Advantageously, the shield may have a recess accommodating the dipole ring.

In another embodiment, the magnet assembly is a horizontally polarized magnetic disk placed beneath the substrate being sputter coated.

The invention can be applied to ferromagnetic and antiferromagnetic materials as well as to other magnetic materials benefitting the imposition of magnetic field during deposition.

The magnet assemblies can be applied also to chemical vapor deposition of magnetic materials.

DETAILED DESCRIPTION OF THE PREFERRED EMBODIMENTS

The invention includes a magnetron sputtering chamber additionally incorporating a magnet within the chamber to impress a horizontal magnetic field near the surface of the wafer being sputter or otherwise coated with a magnetic material.

Figure 4:
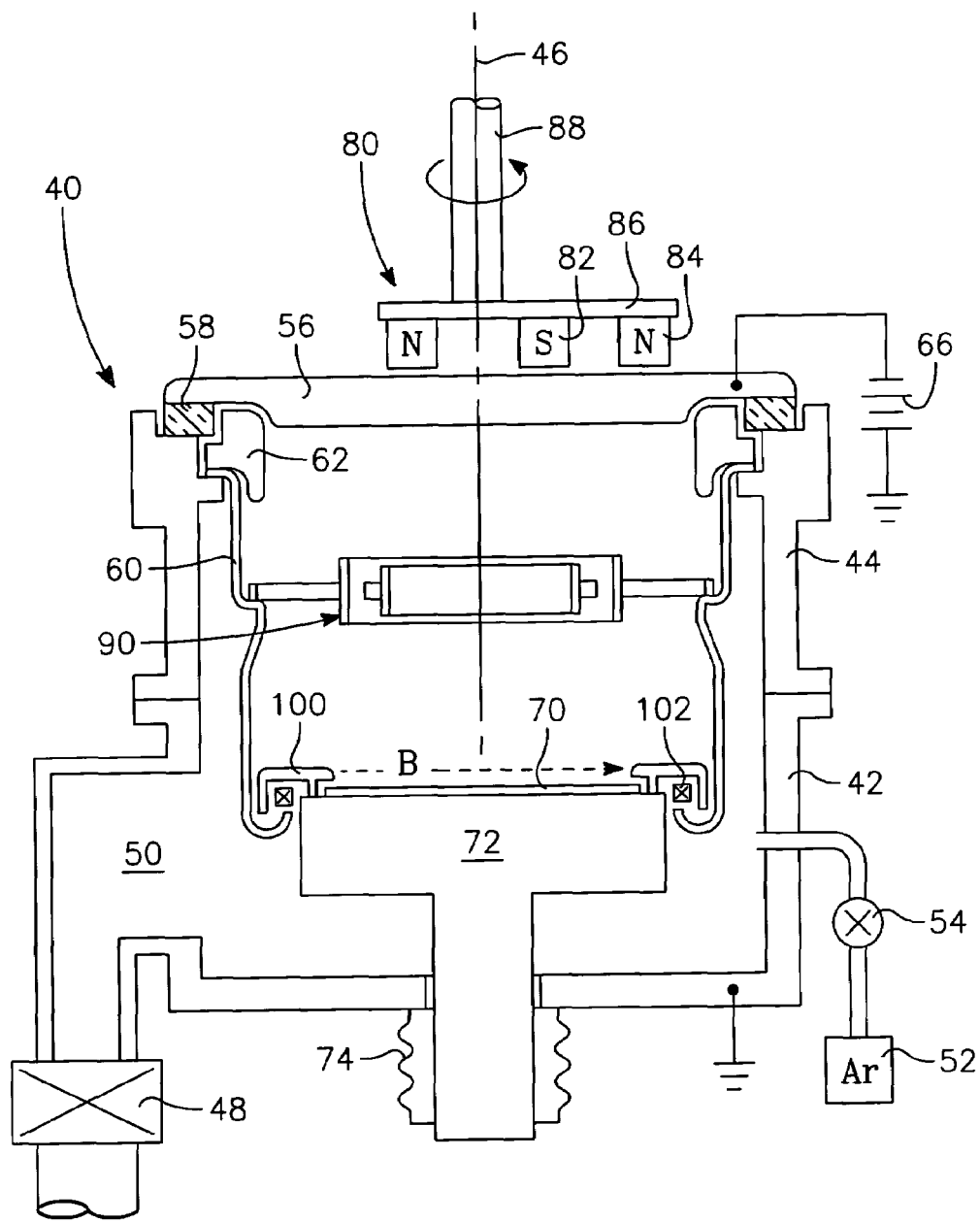
FIG. 4 is a schematic cross-sectional view of a sputtering reactor adapted for magnetic sputtering.

A specific example of a first embodiment of a magnetron sputter reactor 40 of the invention is illustrated in the schematic cross-sectional view of FIG. 4. The fairly conventional portion of the reactor 40 will be described first. Cha et al. have described details of some of the components in U.S. patent application Ser. No. 09/910,585, filed Jul. 20, 2001, now abandoned, published as Publication No. U.S.-2003-0015421-A1, and incorporated herein by reference in its entirety. The reactor 40 includes a vacuum processing chamber principally formed of a chamber body 42 and an adapter 44 formed generally symmetrically about a central axis 46 and electrically grounded. A vacuum pumping system 48 is connected to the chamber through a pumping port 50 and can pump the chamber to a base pressure in the range of $10^{-8}$ Torr. However, an argon gas source 52 supplies argon into the chamber through a mass flow controller 54 to act as a sputtering working gas. Typical argon pressures used in sputtering are in the range of 0.5 to 5 milliTorr.

A sputtering target 56 having at least a surface portion composed of the magnetic metal to be sputtered is supported on the adapter 44 through an isolator 58. An example target composition is the binary magnetic alloy $Ni_{80}Fe_{20}$ although other compositions can enjoy the advantages of the invention. A bottom shield 60 is supported on the adapter 44 and is electrically grounded to it. A dark space shield 62 is supported on and grounded to the bottom shield 60 and has a shape which both protects the isolator 58 from deposition and forms a plasma dark space in opposition to the side of the target 56. A power supply 66 applies a negative DC voltage of approximately −300 to −800 VDC to the target 56. The voltage between the target 56 and shield 60 excites the argon into a plasma, and the positive argon ions are attracted to the negatively biased target 56 to sputter atoms of the target material.

A wafer 70 to be sputter coated is supported on a pedestal 72 in opposition to the target 56. A bellows 74 vacuum seals the pedestal to the chamber 42 but allows the pedestal 72 to be vertically movable to allow transfer of the wafer 70 into and out of the chamber. The pedestal 72 is however electrically isolated from the chamber 42 and is typically left electrically floating.

A magnetron 80 is located at the back of the target 56 to create a horizontal magnetic field near the front face of the target 56 to trap electrons and thereby increase the density of the plasma and increase the sputtering rate. The magnetron 80 should produce a strong magnetic field in order that it sufficiently penetrate the magnetic target 56 to create a reasonably strong magnetic field at the front face of the target 56. As illustrated, a nested magnetron of the type described by Fu in U.S. Pat. No. 6,290,825 may be used. The nested magnetron 80, which has a relatively small area, includes an inner pole 82 of one vertical magnetic polarity surrounded by an annular outer pole 84 of the opposite polarity surrounding the inner pole 82. A magnetic yoke 86 both magnetically couples the two poles 82, 84 and supports them on a motor shaft 88 for rotation about the central axis 46, thereby increasing the uniformity of deposition. Fu's nested magnetron is unbalanced in that its outer pole 84 has a significantly stronger magnetic intensity than its inner pole 86, by at least 50%. The magnetic intensity is the magnetic field flux integrated over the surface area of the respective pole. However, such unbalance is not so crucial in the magnetic application which may operate at lower power and ionization levels. Other types of magnetrons may be used.

The reactor 40 employs two mechanisms to achieve directional sputtering into relatively high aspect-ratio holes. First, the size of the adapter 44 is chosen to produce long throw sputtering, that is, a relatively large spacing between the target 56 and wafer 70, for example a spacing of 190 mm for a 200 mm-diameter wafer 70. A long throw reactor is one in which the spacing between the target and pedestal is at least 75% of the diameter of the wafer. Secondly, a grounded chimney collimator 90 is supported on the bottom shield 60 about midway between the target 56 and wafer 70 to intercept off-angle sputter particles. The grounded collimator 90 has the additional effect of confining the plasma on its side toward the target 56 and away from the wafer 70.

Figure 5:
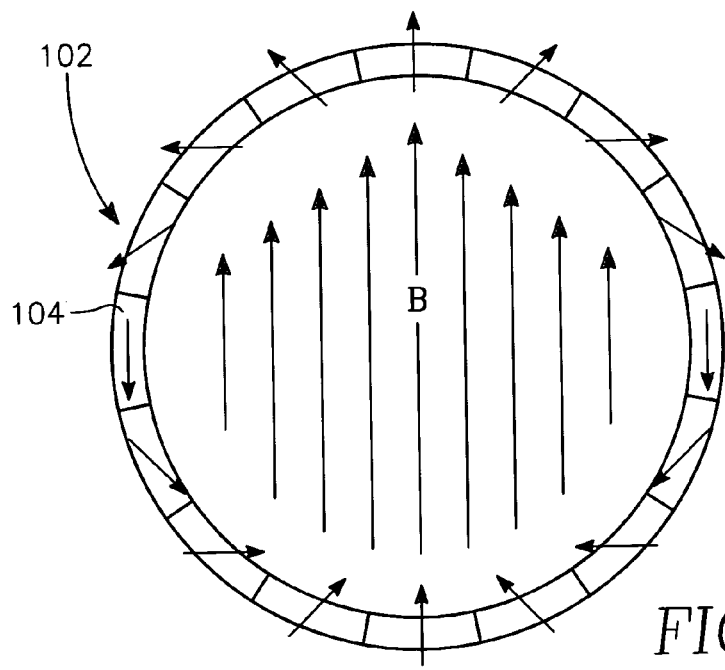
FIG. 5 is a schematic plan view of a magnetic dipole ring usable with the invention.
Figure 6:
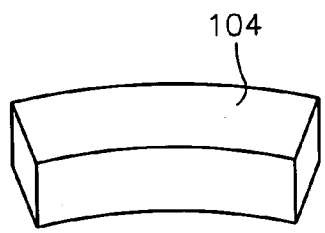
FIG. 6 is an orthographic view of a magnet segment used in the dipole ring of FIG. 5.
Figure 7:
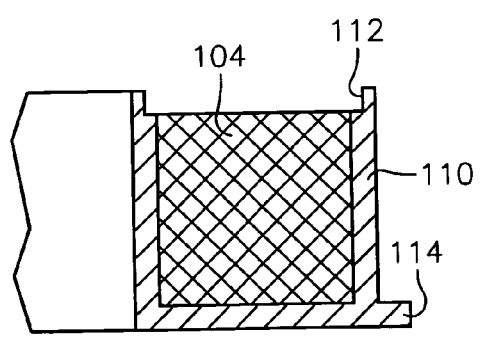
FIGS. 7 and 8 are cross-sectional views of an encapsulated dipole ring and its method of fabrication.

The parts described above are separately fairly conventional in non-magnetic sputtering. The illustrated embodiment of the magnetic sputter reactor 40 additionally includes a cover ring 100 sized and configured to support a magnetic dipole ring 102 within the plane of the wafer 70. The magnetic dipole ring 102, schematically illustrated in the axial plan view of FIG. 5, is intended to produce a uniform horizontal magnetic field B. In its illustrated embodiment, it includes a plurality of arc-shaped magnetic segments 104 arranged in a circle. As illustrated in the orthographic view of FIG. 6, each segment 104 has a rectangular almost square cross section about the circumference of the ring 102. The segments 104 are permanently magnetized in different directions in the plane of the ring 102 such that when they are assembled in the ring their magnetization directions precess by 720° about the circumference of the ring 102 where the direction of precession is opposite the direction of travel around the ring. The effect is akin to a rotating planet orbiting around the sun where the length of the planetary day is the same as the solar year. It is of course understood that the 720° precession is from the first magnet around the circle back to the first magnet so that the precession from the first to the last magnet is correspondingly less. For the 16-segment embodiment of FIG. 5, the magnetization directions of neighboring segments differ by 45° with respect to a fixed direction but by 22.5° with respect to the respective radii of the ring. The magnetization direction a in fixed coordinates of the segment located at the cylindrical angle φ follows the formula $$\alpha = 2\phi + \frac{\pi}{2}.$$

Such a magnetic dipole ring 102 is also known as a Halbach magnet ring or a magic ring. As described by Sekine et al. in the above cited patent, it produces in its interior a magnetic field B which is substantially uniform along a single direction except for substantial edge effects near the periphery of the ring 102 and much reduced edge effects closer to the middle. A small number of magnets intensify the edge effects. The direction of the imposed magnetic field is determined by the magnetization direction of the magnetic dipole, specifically in the illustrated embodiment, the diameter linking the two segments magnetized in the radial directions of the circle. Using the above formula, the direction for which α=0 is the direction of the uniform magnetic field B and will be referred to as the direction of the dipole ring.

Although the arc-shaped magnet segments are effective at producing an intense, fairly uniform magnetic field, they are difficult to fabricate. Rectangular or cylindrical magnets may be used to almost the same effect and with the added advantage of requiring fewer distinctive magnetization directions so as to reduce the parts list.

Figure 1:
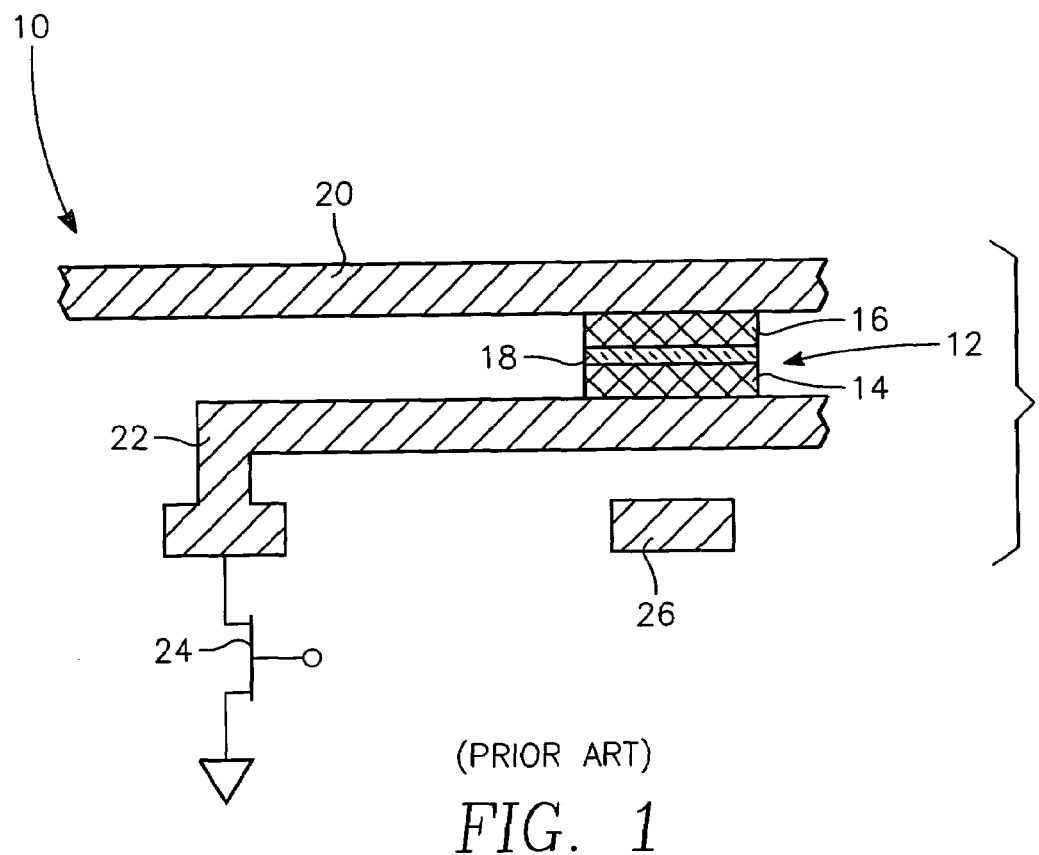
FIG. 1 is a cross-sectional view of a magnetic tunneling junction memory cell.
Figure 2:
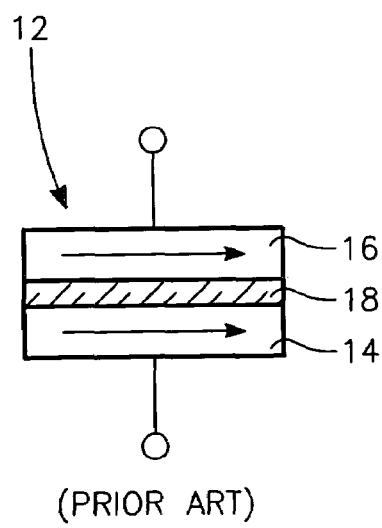
FIGS. 2 and 3 are schematic cross-sectional view of the two magnetic states of the memory cell of FIG. 1.
Figure 3:
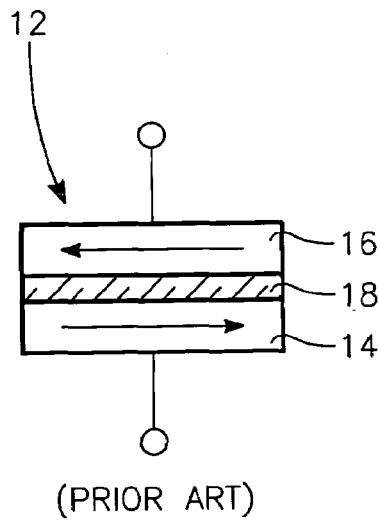

Returning to FIG. 4, the dipole ring 102 creates a substantially uniform horizontal magnetic field B extending along a predetermined horizontal direction at the exposed face of the wafer 70. When the wafer 70 is inserted into the chamber and is laid on the pedestal, its orientation is carefully controlled such the magnetic field direction of the dipole ring 102 coincides with the desired magnetization direction of the ferromagnetic material being sputter coated on the wafer 70, as has been described with reference to FIGS. 1-3.

Even though the magnetic sputter reactor uses a magnetron designed for creating a high-density plasma and hence capable of increasing the ionization fraction of sputtered copper to above 20% in the case of non-magnetic targets, the magnetic sputter reactor of FIG. 4 relies on the strong magnetron to produce a strong magnetic field that partially passes through the magnetically attenuating target. Additionally, the magnetic sputter reactor is typically operated at a relatively low target power, which further reduces the ionization fraction. The very thin magnetic layers required in magnetoelectronics may be quickly deposited at low target power and plasma density. The relatively low effective magnetron field inside the sputtering zone and the low target power result in a low sputter ionization fraction, on the order of 2% or less. Accordingly, the pedestal 72 may be left electrically floating with little effect on the sputter coating. The absence of an electric field near the wafer surface eliminates complicating E×B effects.

The design of the dipole ring should take into account several operational considerations. The dipole ring is preferably placed within the sputter vacuum chamber, which is typically pumped to a baseline vacuum level of $10^{-8}$ Torr or less. Such chamber pressures are achievable by baking the interior of the chamber at about 200° C. during a bake out pumping sequence performed when the chamber is put into operation after installation or maintenance. This interior placement creates two problems, loss of magnetization during bake out and vacuum incompatibility of strong magnetic materials.

The magnetic material should be chosen to have a Curie temperature $T_c$ above the bake out temperature. The Curie temperature is the temperature below which the ferromagnetic material exhibits spontaneous magnetization. If the poled magnetic material is raised above the Curie temperature, its poling direction is lost. That is, when it is again reduced to below the Curie temperature, its magnetization direction is random and the magnetization is likely to form in small randomly oriented magnetic domains unless the material is again poled. Some very strong magnetic materials have an insufficient Curie temperature to survive the 200° C. baking. An alloy of samarium cobalt SmCo 27 H is well known and has an acceptable Curie temperature. The designation 27 H refers to the magnetic strength at the maximum product of BH in the magnetization curve. Liu et al. have described even higher operating temperatures for alloys of FeCuZr with SmCo in "New rare-earth permanent magnets with an intrinsic coercivity of 10 kOe at 500° C.," *Journal of Applied Physics*, vol. 85, no. 8, 15 Apr. 1999, pp. 5660-5662. However, the magnetic materials are not limited to SmCo, and other magnetic materials such as NdBFe having lower Curie temperatures may be acceptable in some lower temperature applications.

SmCo magnets like most rare-earth magnets are formed by sintering metal particles, in this case particles of samarium and cobalt. Sintering typically involves dispersing the particles in a slurry including various sintering agents, forming the slurry into the approximate desired shape, and then heating the formed slurry, also called the green form, to evaporate the sintering agents and cause the metal particles to partially fuse. The sintered material is then mechanically ground into the desired shape, such as the arc-shaped segment 104 of FIG. 6. However, sintered material is not appropriate for use in a high vacuum. The sintering agents are not completely driven away and the sintered material is relatively porous, making it almost impossible to achieve the vacuum levels required in sputtering reactors.

Figure 8:
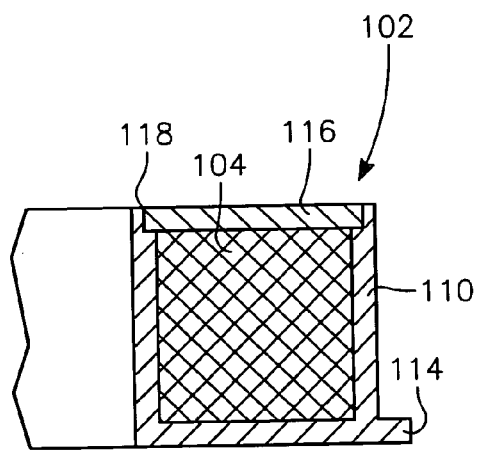

The porosity problem is solved by encapsulating the poled magnetic segments in a vacuum-tight annular carrier. As illustrated in the cross-sectional view of FIG. 8, an annular moat-shaped structure 110 is formed of a vacuum-compatible material such as SS304 stainless steel, a material which is non-magnetic, non-porous, vacuum-compatible, and weldable. Its thickness may be approximately 1.2 mm. The structure 110 includes two sidewalls to be aligned with the central axis of the chamber and a perpendicular bottom wall, all of which are vacuum tight. Recesses 112 are formed at the top of the sidewalls. The structure also includes at least three support tabs 114 of horizontal dimensions of a few millimeters extending radially outwardly from the outer sidewall to engage corresponding structure in the cover ring, as will be described later. More tabs 114 may be needed to support the very thin carrier structure holding heavy magnets.

After all the magnet segments 104 have been poled in their respective directions, they are placed within the moat-shaped structure 110 with their magnetization directions aligned as illustrated in FIG. 5. Poling is typically accomplished by placing the magnet segments in a very strong magnetic field, possibly at a temperature just below the Curie temperature, with the segment being oriented such that the desired magnetization direction is parallel to the applied magnetic field. As illustrated in the cross-sectional view of FIG. 8, an annular cover 116 of the same stainless steel material is placed into the recesses 112 of the moat-shaped structure 110 to cover the moat. Two seams 118 between the cover 116 and the moat sidewalls are vacuum sealed by localized laser welding to form the completed dipole ring 102 of stainless steel carrier holding the magnets 104 without raising the magnets 104 above their Curie temperature. Thereby, the porous magnetic material is encapsulated within the stainless steel carrier.

A magnetic dipole ring 102 has been fabricated according to the above construction with 16 magnet segments 104 having a cross section of about 12 mm square. It produces a fairly uniform magnetic field of about 70 gauss, which is considered sufficient for oriented magnetic sputtering. A field of at least 25 gauss is desired. The small magnet width allows the dipole ring 102 to be placed between the bottom shield 60 and the pedestal 72. The magnet height is sufficient to reliably place the wafer near the vertical middle of the magnets 104. To maximize magnetic uniformity without interfering with sputtering dynamics, the wafer surface should be located within the upper half of the magnets 102 with all or most of the magnetic region below the wafer surface.

The carrier may be formed in other ways. Rectangular magnet segments can be accommodated in a polygonal rather than circular carrier. Transversely magnetized cylindrical magnets may be received in a carrier having corresponding openings and means to angularly fix the magnets with the magnetization direction properly aligned.

Figure 9:
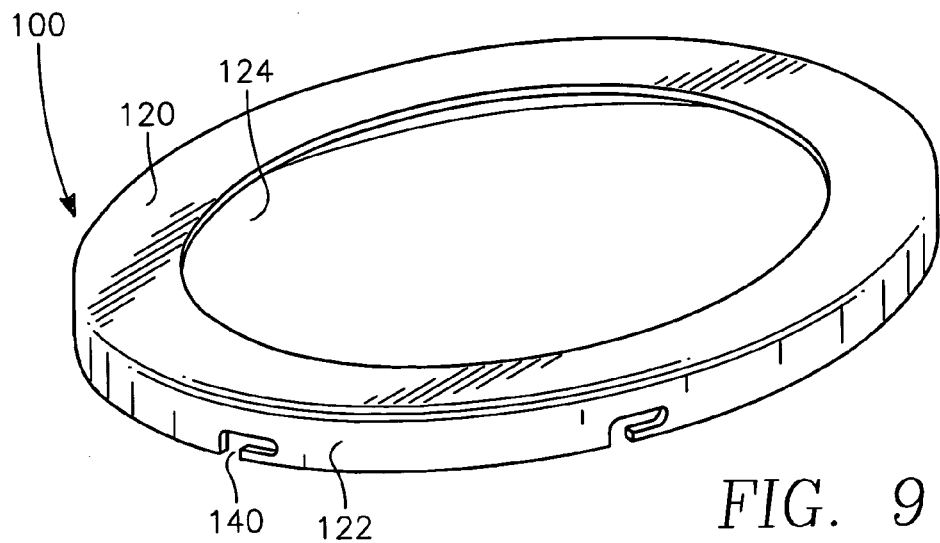
FIG. 9 is an orthographic view of a first embodiment of the invention including a cover ring configured to support the dipole ring of FIG. 8.
Figure 10:
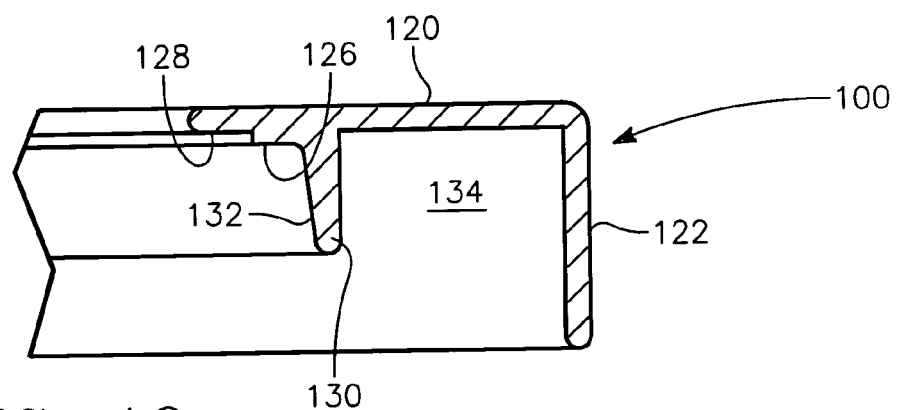
FIG. 10 is a cross-sectional view of the cover ring of FIG. 9.

The dipole ring 102 is conveniently mounted to the cover ring 100 illustrated schematically in cross section in FIG. 4 but more accurately in the orthographic view of FIG. 9. The cover ring 100, preferably formed of non-magnetic SS304 stainless steel, includes an annular inwardly extending top wall 120 and an annular, downwardly projecting outer sidewall 122 enclosing a central aperture 124. The cover ring 100 is intended to protect the portions of the pedestal 72 radially outside of the wafer 70 from sputter depositions. The wafer 70 fits within the central aperture 124, but unillustrated lift rings are used to lift the cover ring 100 off the pedestal 72 during wafer transfer. As shown in the exploded cross-sectional view of FIG. 10, the top wall 120 of the cover ring 100 includes an annular support surface 126 for resting on the periphery of the pedestal 72 or on an intermediate unillustrated deposition ring. The top wall 120 also includes on its innermost bottom side a recess 128 so that the inward tip of the cover ring 100 does not rest on the pedestal 72 and risk being plated at that point to the pedestal 72. A middle centering ring 130 projects downwardly from the top wall 120 and has a sloping inner side to center the cover ring 100 on the periphery of the pedestal 72.

Figure 11:
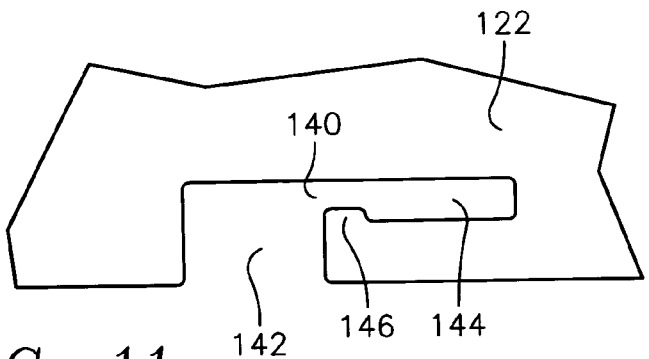
FIG. 11 is a side view of the cutouts formed in the cover ring to support the dipole ring.

The outer sidewall 122 projects downwardly from the outer end of the top wall 120 and is typically used to overlap with the bottom shield 60. For use with the dipole ring 102, an enlarged annular vault 134 is formed below the top wall 120 and between the sidewall 122 and the centering ring 132 and is made large enough to accommodate the dipole ring 102. Additionally, as illustrated orthographically in FIG. 9 and in more detail in the exploded side view of FIG. 11, three or more interlocking cutouts or slots 140 arranged in hook-shaped structures are formed along the bottom edge of the cover sidewall 122 to accept and lock the tabs 114 formed in the carrier of the dipole ring 102. Each cutout 140 includes a downwardly facing open end 142 wide enough to pass the width of the tab 114, a bottomed capture portion 144 also wide enough to accept the tab 114. An intermediate ridge 146 defines a passage between the open end 142 and the capture portion 144 of the cutout 140 that is tall enough to pass the thickness of the tab 114.

In assembly, all the tabs 114 of the dipole ring 102 are raised into the open ends 142 of the respective cutouts 140, the ring 102 is rotated to pass the tabs 114 over the ridges 142, and the ring 102 is then dropped so that the tabs 114 are gravitationally captured in the capture locking portions 144. Thereby, the dipole ring 102 is interlocked and fixed within the vault 134 of the cover ring 100 when the assembly is lowered into the vacuum chamber during installation as long as the cover ring 100 remains in its normal operational orientation. The cover ring 100 is considered as a consumable item since it needs to be periodically replaced or refurbished when it becomes excessively coated with sputter deposition. On the other hand, the dipole ring 102 is protected from being coated and should last much longer. The above design allows the dipole ring 102 to be easily removed from the cover ring 100 and then remounted on a fresh cover ring when the cover ring 100 is periodically replaced The described cover ring protects only the pedestal. Other similarly configured rings, which will also be called cover rings, may perform additional functions. They may additionally shield the periphery of the wafer. They may clamp the wafer to the pedestal. They may focus the plasma around the wafer. The integration of the dipole ring 102 with the cover ring 100 provides several major advantages. The dipole ring 102 is placed close to the wafer and can be made to occupy relatively small area in the confined plasma chamber. The chamber design other than the two rings 100, 102 and the composition of the target closely follows the design for a non-magnetic sputter reactor, the latter of which will continue to dominate the commercial reactor market. Nonetheless, with a magnetic target, a magnetic dipole ring, and a redesigned cover ring, the widely available non-magnetic sputter reactor becomes a magnetic sputter reactor. There is no need for a massive redesign of the chamber to accommodate auxiliary magnets.

When the magnetic dipole ring 102 is used to control the orientation of the ferromagnetic film on the wafer 70 supported on the pedestal 72, the magnetic orientation of the magnetic dipole ring 102 needs to be maintained relative to the desired magnetization direction on the wafer 70. Variations of more than a few degrees of the film's magnetic orientation, for example, more than 5 or 10°, will significantly degrade the operational characteristics of the fabricated devices. The angular orientations of several elements need to be controlled if the magnetic orientation is to be controlled. The wafer transfer mechanism responsible for placing the wafer 70 on the pedestal 72 must accurately place the wafer 70 on the pedestal with correct angular orientation. The wafer orientation is indexed to an edge notch or optical indicia formed in the wafer 70. Conventional equipment is available for detecting the orientation inside a vacuum transfer chamber and accordingly reorienting the wafer.

Maintaining the orientation of the magnetic dipole ring 102 involves at least three factors. The magnet segments 104 need to be indexed to the carrier of FIG. 8. This may be satisfied by careful assembly, but a single transverse barrier in the moat of the carrier referenced to a particular one of the tabs 114 eases this assembly requirements. The carrier of the dipole ring 102 needs to be angularly aligned to the cover ring 100. This may be accomplished by using an irregular pattern of tabs 114 and cutouts 140 so that it is possible to assemble the dipole ring 102 and cover ring 100 in only one relative angular orientation. Different mechanisms are possible to align the cover ring 100 to the pedestal and to maintain this alignment during repetitive operation. For example, the lift pins are located at particular positions on the pedestal. The engagement of the lift pins with the bottom of the cover ring 100 may include self-centering indentations which not only provide the initial alignment but also prevent the cover ring 100 from walking around the circumference of the pedestal 72.

In practice, the magnetic uniformity produced by the magnetic dipole ring could be improved. The number of magnet segments can be increased to 16 or even 32. Further increases make the structure unduly complex to manufacture. Even with 32 segments, non-uniform edge effects are prominent. The more uniform region extends in an oval between the two magnet segments aligned with chamber radii. Sekine et al. and Miyata in the above cited patents attempt to improve the magnetic uniformity by changing the form of the magnets and their arrangement around the chamber. However a simpler approach is based on the non-uniformity being an edge effect. Accordingly, uniformity is improved by moving the magnetic dipole ring closer to the chamber sidewalls though preferably still within the vacuum chamber.

Figure 12:
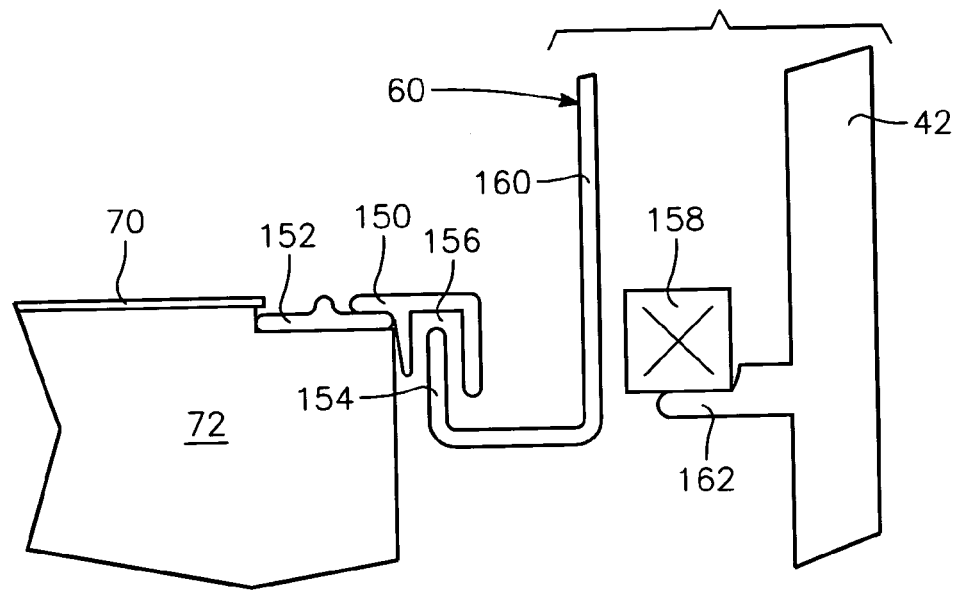
FIG. 12 is a plan view of a second embodiment of the invention in which the chamber wall supports the dipole ring.

In an alternative embodiment based on this effect and illustrated in the cross-sectional view of FIG. 12, a more conventional cover ring 150 is supported during sputtering on a deposition ring 152, which rests in an annular recess at the periphery of the pedestal 72. An upwardly extending inner wall 154 of the bottom shield 60 fits within a downwardly facing vault 156 of the cover ring 150. For loading and unloading of wafers 70, the pedestal 72 is lowered so that a terminating upper end of the inner wall 154 of the bottom shield 60 supports the cover ring 150 and lifts it off the deposition ring 152. As the pedestal 72 if further lowered, unillustrated lift pins in the pedestal 72 lift the wafer 70 off the pedestal 72 while the deposition ring 152 continues to rest on the pedestal 72. A wafer transfer paddle removes the wafer 70 from the lift pins and places a new one there.

In this embodiment, an encapsulated dipole magnet ring 158 is disposed between the chamber wall 42 and an downwardly extending outer wall 160 of the bottom shield 60. The dipole ring 158 may freely rest upon centering dowels 162 extending from the chamber wall 42. Alternatively, the dipole ring 158 may be supported on the outer shield wall 160 by a configuration that is inverse to the carrier tabs 114 and hook-shaped slots 140 in the cover ring 100 of FIGS. 7-11. For example, hook-shaped slots are formed in upwardly extending hangers formed in the magnet carrier near its upper inner corner of the carrier to engage tabs formed in the outer shield wall 160 and extending radially outwardly from it.

Figure 13:
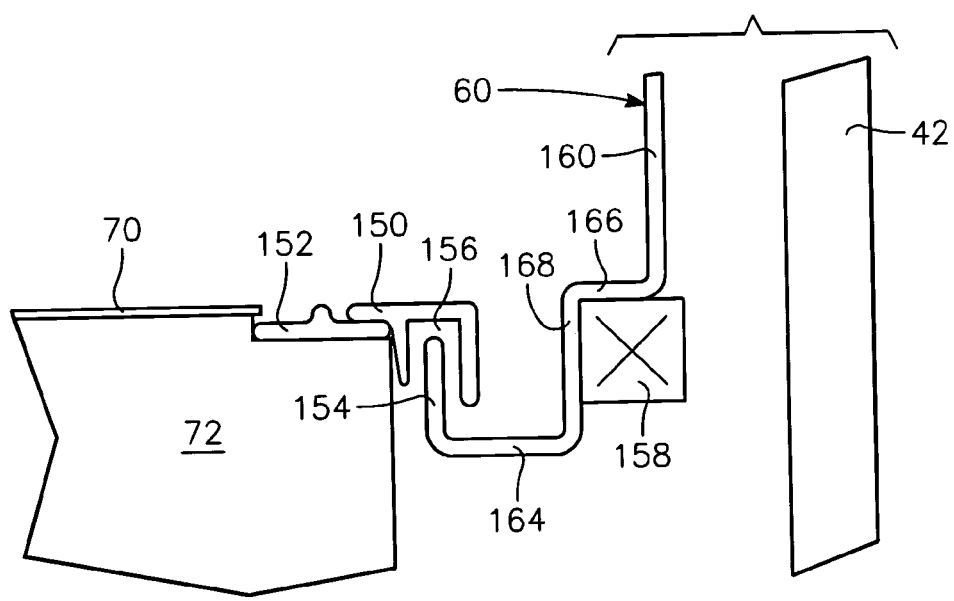
FIG. 13 is cross-sectional view of a third embodiment of the invention in which the shield supports the dipole ring.

The configuration of FIG. 12 however places a constraint on the placement of the bottom shield 60 with respect to the chamber wall 42. To alleviate this constraint, in another embodiment illustrated in the cross-sectional view of FIG. 13, a dog leg is formed at the corner between the outer wall 160 and a lower wall 164 of the bottom shield 60. The dog leg is formed by an annular ledge 166 and an annular middle wall 168. The dipole ring 158 is fitted either partially or completely within a recess formed by the ledge 166 and the middle wall 168. It may be attached to either the ledge 166 or the middle wall 168 prior to the shield 60 being lowered into the vacuum chamber and detachably fixed there by means similar to those described before or by other mechanical fixing means. In either embodiment of FIGS. 12 and 13, the angular alignment of the dipole ring 158 with respect to the chamber 42 must be maintained in order to align the magnetic material on the wafer 70 in the correct direction.

A possible disadvantage of placing the magnetic dipole ring outside the shield is that magnetic material is coated onto the shield and could possibly shunt part of the magnetic field of the dipole ring and thus decrease magnetic intensity adjacent the wafer. However, this is not considered a problem. The shields are typically replaced after 10,000 cycles. MRAM applications typically require the deposition of no more than 2 nm of magnetic material per cycle. Assuming full deposition on the shield, at the end of life the magnetic coating on the shield is no more than 20 µm, which is insufficient to screen the magnetic field from the interior of the shields.

Other types of attachments between the dipole ring carrier and either the cover ring or the shield. The attachment may be made outside the chamber so threaded fasteners may be used. The attached assembly is then lowered into the chamber.

Figure 14:
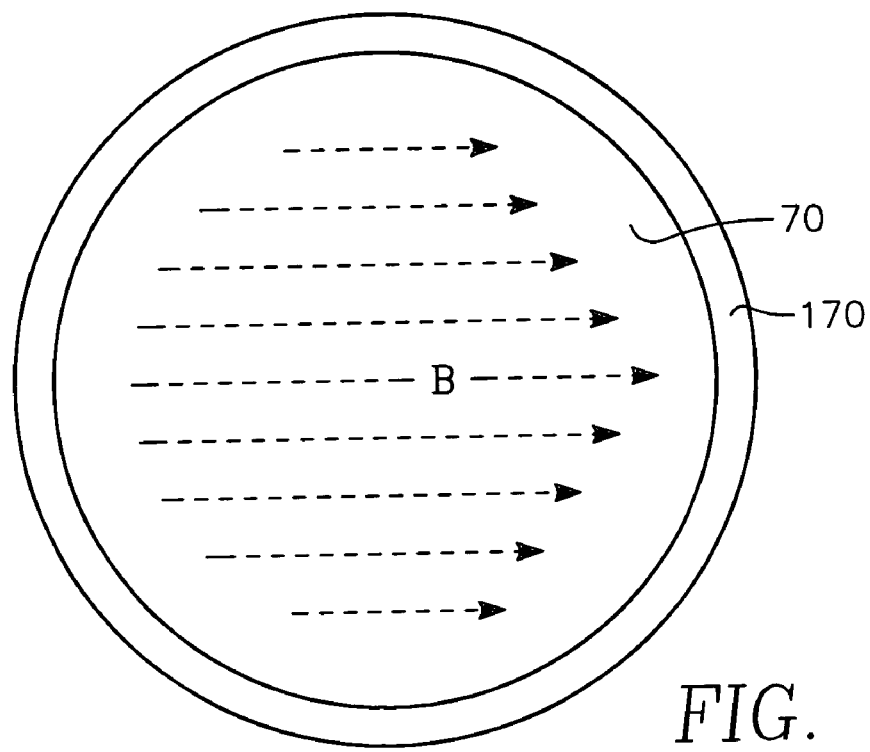
FIG. 14 is a plan view of a fourth embodiment of the invention including a horizontal magnetization assembly incorporated into the wafer support pedestal.
Figure 15:
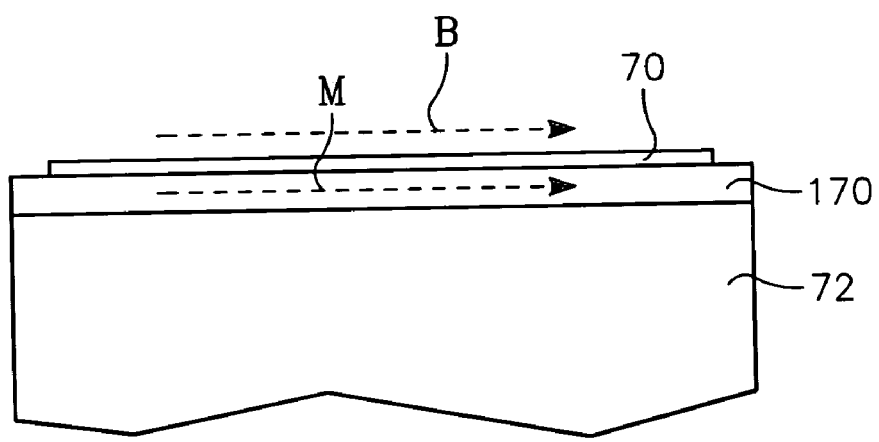
FIG. 15 is an elevational view of the embodiment of FIG. 14.

An alternative embodiment of a magnet providing a uniform magnetic field at the surface of the wafer 70 is illustrated in the cross sectional view of FIG. 14 and the plan view of FIG. 15. A uniformly horizontally magnetized layer 170 of magnetization M is fixed to the top of the pedestal 72 and supports the wafer 70 during sputtering of the ferromagnetic material, which is deposited with the same magnetization direction as the magnetization M of the magnetized layer 170.

A process has been developed for sputtering NiFe using the equipment of FIGS. 4-11. The use of the SIP magnetron and the grounded dark space shield promotes plasma ignition and stability. A plasma can be struck and sustained at pressures as low as 0.8 milliTorr. Typical pressure ranges for sputtering NiFe extend from 0.8 to 20 milliTorr. With the long-throw configuration and collimator, step coverage into 0.25 µm holes with aspect ratios of 2 can be larger than 20%. Although a 12 kW DC power supply was used in development, process powers for magnetic sputtering are typically in the range of 500 W to 6 kW for a 200 mm wafer. At these powers, the sputtering ionization fraction is estimated to be less than 2%. As a result, the magnetic field at the wafer does not influence the dominant neutral sputter fraction.

Although the magnetic dipole ring has been developed for sputter deposition of magnetically oriented coatings, it can also be used for deposition of similar materials by chemical vapor deposition (CVD) from one or more precursor gases that react to form a magnetic material on the wafer. Preferably, however, thermal CVD is preferred because plasma-enhanced CVD tends to create intense plasmas and strong electric fields adjacent the wafer. An additional impressed horizontal magnetic field introduces significant asymmetries in plasma-enhanced CVD. Of course, for thermal CVD with the dipole ring disposed inside the chamber, the magnets' Curie temperature needs to be higher than the CVD temperature.

The invention has been described with respect to sputtering NiFe. Other ferromagnetic materials benefit from the invention. The anti-ferromagnetic layer described above may be composed of MnFe or other anti-ferromagnetic metals and may be poled by being sputter coated in the presence of the magnets described above in order to align its domains in the optimum direction. It is possible to sputter the free magnetic layer in the presence of a horizontal magnetic field since it can thereafter be selectively repolarized. Further, the magnetic dipole ring can be used for more general purposes than permanent alignment of ferromagnetic coatings. The characteristics of magnetizable materials can be affected by the magnetic fields they experience during deposition even though they may be deposited with no net magnetic polarity, for example, by forming the easy magnetization direction in a specified direction. For example, the polarized deposition of the free magnetic layer may be used to orient any small magnetic domains along the direction used for selective polarization. The polarized deposition of the free magnetic layer has the further advantage of allowing the same sputter reactor with included magnetic dipole ring to be used to deposit both the free and the fixed magnetic layers.

Although the invention has been described for arc-shaped magnet segments which closely fit together, the magnets may have other configurations including cylindrical magnets magnetized across their diameters such that a rotation of the cylindrical magnet in a multi-magnet annular carrier determines its magnetization direction.

Although sixteen magnet segments provide adequate field uniformity, the uniformity can be improved by increasing the number of magnets, for example, to thirty two or even more. It may be possible to differentially magnetize a unitary magnetic ring with the same magnetic precession. A magnetic dipole ring should have at least eight magnets to achieve any reasonable uniformity.

The sputter reactor described above employs both a collimator and long throw to both isolate the horizontal aligning magnetic field from the plasma and magnetic field associated with the magnetron and to promote deep hole filling. Somewhat similar effects can be obtained by using an even long throw ratio, for example, greater than 2 or 2.5, without the use of the collimator.

Accordingly, the various embodiments of the invention allow the deposition of preferentially aligned magnetic materials with only minor changes to a convention magnetron sputter reactor.

The invention claimed is:

1. An annular cover ring for use in a plasma deposition reactor having a pedestal for supporting on an upper horizontally extending support surface thereof a substrate to be coated and a magnetic ring disposed around said pedestal, comprising:

an annular roof portion covering a periphery of said pedestal and extending radially outwardly from said pedestal;

an annular first projection extending downwardly from said roof portion along a side of said pedestal;

an annular second projection extending downward from roof portion radially outside of said first projection, a downwardly facing vault formed by said roof portion and said first and second projections to accommodate therein said magnetic ring; and at least three attachments formed in said second projection detachably mounting said magnetic ring within said vault.

2. The cover ring of claim 1, wherein said magnetic ring comprises a magnetic dipole ring creating a substantially uniform horizontal magnetic field on said support surface.

3. The cover ring of claim 2, wherein said dipole ring comprises a plurality of permanent magnets arranged in a circle and having respective magnetic polarities precessing 720° around said circle.

4. The cover ring of claim 1, wherein said first projection has a sloped sidewall centering said cover ring on said pedestal.

5. The cover ring of claim 1, wherein said at least three attachments each comprise a hook-shaped slot formed at a bottom of said second projection removably receiving horizontally extending tabs on said magnetic ring.

6. A unitary electrically conducting sputter shield for use in a plasma sputter reactor having a central axis and placeable within and supportable on sidewalls of said reactor, comprising:
  an annular outer wall having at least an annular first wall portion extending along said central axis and including integral attachments for detachably engaging and supporting a magnetic ring assembly fittable between said outer wall and said sidewalls;
  an annular bottom wall connected to said outer wall and extending perpendicular to said central axis; and
  an annular inner wall connected to said bottom wall, disposed within said first portion of said outer wall, extending along said central axis, and having a terminating end.

7. The sputter shield assembly of claim 6, wherein the magnetic ring assembly comprises a magnetic dipole ring.

8. The sputter shield assembly of claim 7, wherein said magnetic dipole ring comprises a plurality of permanent magnets arranged in a circle and having respective magnetic polarities precessing 720° around said circle.

9. The sputter shield assembly of claim 6, wherein the attachments include hook-shaped slots.

10. A unitary electrically conducting sputter shield for use in a plasma sputter reactor having a central axis and placeable within and supportable on sidewalls of said reactor, comprising:
  an annular outer wall having at least an annular first wall portion extending along the central axis and including integral attachments for detachably engaging and supporting a ring assembly fittable between the outer wall and the sidewalls, the attachments comprising tabs and slots on different ones of the outer wall and the ring assembly;
  an annular bottom wall connected to the outer wall and extending perpendicular to the central axis; and
  an annular inner wall connected to the bottom wall, disposed within said first portion of the outer wall, extending along the central axis, and having a terminating end.

11. The sputter shield assembly of claim 10, where the slots are hook-shaped to capture the tabs.

12. A sputter shield assembly for use in a plasma sputter reactor having a central axis and placeable within and supportable on sidewalls of said reactor, comprising a unitary electrically conducting shield including:
  an annular outer wall having at least an annular first wall portion extending along said central axis and including integral attachments for detachably engaging and supporting a ring assembly fittable between said outer wall and said sidewalls;
  an annular bottom wall connected to said outer wall and extending perpendicular to said central axis; and
  an annular inner wall connected to said bottom wall, disposed within said first portion of said outer wall, extending along said central axis, and having a terminating end.

13. The sputter shield assembly of claim 12, further comprising a magnetic dipole ring which is the ring assembly.

14. The sputter shield assembly of claim 13, wherein the magnetic dipole ring comprises a plurality of permanent magnets arranged in a circle and having respective magnetic polarities extending in a plane perpendicular to the central axis and precessing 720° around the circle.

15. The sputter shield assembly of claim 12, wherein the attachments include hook-shaped slots.

* * * * *